US007752520B2

(12) United States Patent
Xia

(10) Patent No.: US 7,752,520 B2
(45) Date of Patent: Jul. 6, 2010

(54) APPARATUS AND METHOD CAPABLE OF A UNIFIED QUASI-CYCLIC LOW-DENSITY PARITY-CHECK STRUCTURE FOR VARIABLE CODE RATES AND SIZES

(75) Inventor: Bo Xia, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 10/997,581

(22) Filed: Nov. 24, 2004

(65) Prior Publication Data

US 2006/0109821 A1 May 25, 2006

(51) Int. Cl.
*H03M 13/00* (2006.01)

(52) U.S. Cl. ....................... 714/752; 714/758; 714/801; 714/804

(58) Field of Classification Search ................. 714/752, 714/758, 801, 804
See application file for complete search history.

(56) References Cited

U.S. PATENT DOCUMENTS

| | | | | |
|---|---|---|---|---|
| 6,567,465 | B2 * | 5/2003 | Goldstein et al. | 375/222 |
| 6,633,856 | B2 * | 10/2003 | Richardson et al. | 706/15 |
| 7,058,873 | B2 * | 6/2006 | Song et al. | 714/752 |
| 7,107,505 | B2 * | 9/2006 | Thesling, III | 714/755 |
| 7,162,684 | B2 * | 1/2007 | Hocevar | 714/800 |
| 7,188,297 | B2 * | 3/2007 | Blankenship et al. | 714/758 |
| 2003/0152158 | A1 | 8/2003 | Torres et al. | |
| 2005/0030887 | A1 | 2/2005 | Jacobsen et al. | |
| 2005/0149845 | A1 * | 7/2005 | Shin et al. | 714/801 |
| 2005/0154958 | A1 | 7/2005 | Xia et al. | |
| 2005/0166131 | A1 | 7/2005 | Xia et al. | |
| 2006/0109821 | A1 | 5/2006 | Xia | |
| 2006/0123277 | A1 * | 6/2006 | Hocevar | 714/704 |
| 2006/0156206 | A1 * | 7/2006 | Shen et al. | 714/784 |
| 2007/0022354 | A1 * | 1/2007 | Yu et al. | 714/755 |

FOREIGN PATENT DOCUMENTS

| | | | |
|---|---|---|---|
| EP | 1 596 501 | A | 11/2005 |
| TW | 569548 | B | 1/2004 |

OTHER PUBLICATIONS

Classon et al. LDPC coding for OFDMA PHY, Aug. 24, 2004. IEEE 802.16 Broadband wireless Access working Group. pp. 1-10.*
Classon et al: LDPC Coding for OFDMA PHY; IEEE 802.16, Session #33, Swoul, Korea, Aug. 30, 2004; pp. 1-17; XP-002371218.

(Continued)

*Primary Examiner*—Sam Rizk
(74) *Attorney, Agent, or Firm*—Blakely, Sokoloff, Taylor & Zafman LLP

(57) ABSTRACT

An embodiment of the present invention provides an apparatus, comprising a transceiver capable of a unified quasi-cyclic low-density parity-check structure for variable code rates and sizes using a unified base matrix definition. This base matrix definition may be a concatenation of multiple square matrices $$S_{m\times Rm}=(S_{m\times m}^{R}|S_{m\times m}^{R-1}|\ldots|S_{m\times m}^{3}|S_{m\times m}^{2}|S_{m\times m}^{1})$$

and the base matrix for rate (r−1)/r may be $$S_{m\times rm}=(S_{m\times m}^{r}|S_{m\times m}^{r-1}|\ldots|S_{m\times m}^{3}|S_{m\times m}^{2}|S_{m\times m}^{1})$$

for r=2, 3, . . . , R.

16 Claims, 1 Drawing Sheet

105 100 110

$$H_5^1=\begin{bmatrix}0&0&0&0&1\\1&0&0&0&0\\0&1&0&0&0\\0&0&1&0&0\\0&0&0&1&0\end{bmatrix}\qquad H_5^\infty=\begin{bmatrix}0&0&0&0&0\\0&0&0&0&0\\0&0&0&0&0\\0&0&0&0&0\\0&0&0&0&0\end{bmatrix}$$

Length $mz\times nz$ parity-check matrix $H$ $$H=\begin{bmatrix}H_z^{s_{11}}&H_z^{s_{12}}&\cdots&H_z^{s_{1,n-1}}&H_z^{s_{1n}}\\H_z^{s_{21}}&H_z^{s_{22}}&\cdots&H_z^{s_{2,n-1}}&H_z^{s_{2n}}\\\vdots&\vdots&\vdots&\vdots&\vdots\\H_z^{s_{m-1,1}}&H_z^{s_{m-1,2}}&\cdots&H_z^{s_{m-1,n-1}}&H_z^{s_{m-1,n}}\\H_z^{s_{m1}}&H_z^{s_{m2}}&\cdots&H_z^{s_{m,n-1}}&H_z^{s_{mn}}\end{bmatrix}$$ 115

Expansion factor $z$ and a base matrix $$S_{m\times n}=\begin{bmatrix}s_{11}&s_{12}&\cdots&s_{1,n-1}&s_{1n}\\s_{21}&s_{22}&\cdots&s_{2,n-1}&s_{2n}\\\vdots&\vdots&\vdots&\vdots&\vdots\\s_{m-1,1}&s_{m-1,2}&\cdots&s_{m-1,n-1}&s_{m-1,n}\\s_{m1}&s_{m2}&\cdots&s_{m,n-1}&s_{mn}\end{bmatrix}$$ 120

OTHER PUBLICATIONS

Fossorier: Quasi-Cyclic Low-Density Parity-Check Codes From circulant Permutaion Matrices; IEEE Transactions on Information Theory, Piscataway, NJ, vol. 50, No. 8; Aug. 1, 2004; pp. 1788-1793; XP-002346039.

Yang et al: Performance of Efficiently Encodable Low-Density Parity-Check Codes in Noise Bursts on teh EPR4 Channel; IEEE Transactions on Magnetics, vol. 40, No. 2; Mar. 1, 2004; pp. 507-512; XP-002339008.

PCT/US2005/045263 Int'l Search Report & Written Opinion dated Mar. 27, 2006.

U.S. Appl. No. 11/166,591; Title:"Techniques for Reconfigurable decoder for a Wireless System.", filed Jun. 24, 2005; Inventor: Anthony Chun.

U.S. Appl. No. 11/344,036; Title:"Techniques for Low Density Parity Check for Forward Error Correction in High-Data Rate Transmission.", filed Jan. 31, 2006; Inventor: Xia et al.

Chapter 1 International Preliminary Report on Patentability from PCT/US2005/041563 mailed Jun. 7, 2007; 9 pages.

Zongwang Li, et al. "A Class of Good Quasi-Cyclic Low-Density Parity Check Codes Based on Progressive Edge Growth Graph", Department of Electrical and Computer Engineering, Carnegie Mellon University, 5000 Forbes Ave., PA 15213, 0-7803-8622-1/04/$20.00 9 (c)2004 IEEE, 1990-1994, 5pgs.

Hong Wen et al., "A New Family of Irregular LDPC Codes", Chengdu University, Chengdu, Sichuan 610106 P.R. China, 0-7803-7938-1/04/$20.00 ?2004 IEEE.

* cited by examiner

100

105

$$H_5^1 = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix}$$

110

$$H_5^\infty = \begin{bmatrix} 0 & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{bmatrix}$$

Length $mz \times nz$ parity-check matrix $H$ $$H = \begin{bmatrix} H_z^{s_{11}} & H_z^{s_{12}} & \cdots & H_z^{s_{1,n-1}} & H_z^{s_{1n}} \\ H_z^{s_{21}} & H_z^{s_{22}} & \cdots & H_z^{s_{2,n-1}} & H_z^{s_{2n}} \\ \vdots & \vdots & \vdots & \vdots & \vdots \\ H_z^{s_{m-1,1}} & H_z^{s_{m-1,2}} & \cdots & H_z^{s_{m-1,n-1}} & H_z^{s_{m-1,n}} \\ H_z^{s_{m1}} & H_z^{s_{m2}} & \cdots & H_z^{s_{m,n-1}} & H_z^{s_{mn}} \end{bmatrix}$$

115

Expansion factor $z$ and a base matrix $$S_{m \times n} = \begin{bmatrix} s_{11} & s_{12} & \cdots & s_{1,n-1} & s_{1n} \\ s_{21} & s_{22} & \cdots & s_{2,n-1} & s_{2n} \\ \vdots & \vdots & \vdots & \vdots & \vdots \\ s_{m-1,1} & s_{m-1,2} & \cdots & s_{m-1,n-1} & s_{m-1,n} \\ s_{m1} & s_{m2} & \cdots & s_{m,n-1} & s_{mn} \end{bmatrix}$$

APPARATUS AND METHOD CAPABLE OF A UNIFIED QUASI-CYCLIC LOW-DENSITY PARITY-CHECK STRUCTURE FOR VARIABLE CODE RATES AND SIZES

BACKGROUND

Wireless communication has become prevalent throughout society creating the need for faster and more reliable wireless communication techniques. Although not limited in this respect, several techniques may be adopted in wireless standards such as the Institute for Electronic and Electrical Engineers (IEEE) 802.11n, 802.16e, and 802.15.3a standards. In an attempt to improve the reliability of these communication techniques, they may employ forward error correction capabilities such as quasi-cyclic low-density parity-check (QC-LDPC) codes which have been proposed as a strong forward error correction (FEC) candidate with low complexity and high performance. However, there are shortcomings to these FEC techniques when variable code rates and sizes are used.

Thus, a strong need exists for an apparatus and method capable of improved wireless communication with improved FEC that overcomes the aforementioned shortcomings.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 illustrates a cyclic permutation matrix $H_z^s$ and a length mz×nz parity-check matrix H as well as a base matrix.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

It should be understood that embodiments of the present invention may be used in a variety of applications. Although the present invention is not limited in this respect, the devices disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's), wireless local area networks (WLAN), personal area networks (PAN, and the like).

Quasi-cyclic low-density parity-check (QC-LDPC) codes have been proposed as a strong forward error correction (FEC) candidate with low complexity and high performance. An embodiment of the present invention provides a QC-LDPC structure that is capable of accommodating codes of multiple rates and sizes.

An LDPC code may be characterized by a binary parity-check matrix H with a low density of 1's. A structured LDPC code may be one where the locations of the 1's in its parity-check matrix follow a certain pattern. QC-LDPC codes may form a special class of structured codes whose parity-check matrices may comprise cyclic permutation matrices or, shifted identity matrices.

Turning now to FIG. 1, shown generally as 100, a cyclic permutation matrix $H_z^s$ is generated by shifting the diagonal of a z×z identity matrix to the left by s times. Here z is called the expansion factor or scale factor, and s is called the shift. The symbol $H_z^\infty$ may be used to denote the special case of zero-matrix 110. An example is illustrated in FIG. 1 at 105.

A length mz×nz parity-check matrix H may be constructed as shown at 115. In an embodiment of the present invention, H may be uniquely determined by the expansion factor z and a base matrix with its code rate being (n-m)/n as shown at 120. Code rates of 1/2, 2/3, 3/4, 5/6 and 7/8 may be typically used in wireless communication systems, although the present invention is not limited in this respect.

In some communication standards, for example, but not limited to, wireless communication standards 802.16e and 802.11n, it may be desired for each LDPC code rate to have a family of codes of different code sizes. This may be achieved by expanding a single base matrix with different expansion factors. However, this approach may still require a base matrix definition for each code rate.

An embodiment of the present invention provides a unified base matrix definition for multiple codes rates. This base matrix definition may be a concatenation of multiple square matrices $$S_{m\times Rm}=(S_{m\times m}^{R}|S_{m\times m}^{R-1}|\ldots|S_{m\times m}^{3}|S_{m\times m}^{2}|S_{m\times m}^{1})$$

and the base matrix for rate (r−1)/r may be $$S_{m\times rm}=(S_{m\times m}^{r}|S_{m\times m}^{r-1}|\ldots|S_{m\times m}^{3}|S_{m\times m}^{2}|S_{m\times m}^{1})$$

for r=2,3, . . . , R.

An embodiment of the present invention also provides a method of forward error correction, comprising employing a transceiver capable of a unified quasi-cyclic low-density parity-check structure for variable code rates and sizes which uses a unified base matrix definition.

Further, this base matrix definition may be a concatenation of multiple square matrices $$S_{m\times Rm}=(S_{m\times m}^{R}|S_{m\times m}^{R-1}|\ldots|S_{m\times m}^{3}|S_{m\times m}^{2}|S_{m\times m}^{1})$$

and the base matrix for rate (r−1)/r may be $$S_{m\times rm}=(S_{m\times m}^{r}|S_{m\times m}^{r-1}|\ldots|S_{m\times m}^{3}|S_{m\times m}^{2}|S_{m\times m}^{1})$$

for r=2,3, . . . , R.

An embodiment of the present invention may further provide an article comprising a storage medium having stored thereon instructions, that, when executed by a computing platform, results in providing forward error correction, by controlling a transceiver capable of a unified quasi-cyclic low-density parity-check structure for variable code rates and sizes which uses a unified base matrix definition. Further, this base matrix definition may be a concatenation of multiple square matrices $$S_{m\times Rm}=(S_{m\times m}^{R}|S_{m\times m}^{R-1}|\ldots|S_{m\times m}^{3}|S_{m\times m}^{2}|S_{m\times m}^{1})$$

and the base matrix for rate (r−1)/r may be $$S_{m\times rm}=(S_{m\times m}^{r}|S_{m\times m}^{r-1}|\ldots|S_{m\times m}^{3}|S_{m\times m}^{2}|S_{m\times m}^{1})$$

for r=2,3, . . . , R.

QC-LDPC codes may be decoded using layered decoding techniques to achieve increased potential decoding throughput. Higher potential throughput can be achieved by further reducing the size of the base matrices, and more precisely, the row length m.

In an embodiment of the present invention, row length m≧4 may be the minimal requirement to achieve good performance, thus an embodiment of the present invention provides the base matrix sizes 4×8 for rate $$\frac{1}{2},$$

4×12 for rate $$\frac{2}{3},$$

4×16 for rate $$\frac{3}{4},$$

4×24 for rate 5/6 and 4×32 for rate $$\frac{7}{8}.$$

Further, an embodiment of the present invention provides, although is not limited to, the use of a unified base matrix definition. The definition may be, but again is not limited to:

$$S_{4\times 32}=(S_{4\times 4}^{8}|S_{4\times 4}^{7}|S_{4\times 4}^{6}|S_{4\times 4}^{5}|S_{4\times 4}^{4}|S_{4\times 4}^{3}|S_{4\times 4}^{2}|S_{4\times 4}^{1})$$

for rate $$\frac{7}{8},$$

and $$S_{4\times 24}=(S_{4\times 4}^{6}|S_{4\times 4}^{5}|S_{4\times 4}^{4}|S_{4\times 4}^{3}|S_{4\times 4}^{2}|S_{4\times 4}^{1})$$

for rate 5/6, and $$S_{4\times 24}=(S_{4\times 4}^{4}|S_{4\times 4}^{3}|S_{4\times 4}^{2}|S_{4\times 4}^{1})$$

for rate $\frac{3}{4}$, and $$S_{4\times12}=(S_{4\times4}^{3}|S_{4\times4}^{2}|S_{4\times4}^{1})$$

for rate $\frac{2}{3}$, and $$S_{4\times8}=(S_{4\times4}^{2}|S_{4\times4}^{1})$$

for rate $\frac{1}{2}$.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An apparatus, comprising:

a transceiver configured to use in transmissions a unified quasi-cyclic low-density parity-check structure for variable code rates and sizes, the structure being determined by an expansion factor z and a unified base matrix definition that is a concatenation of multiple square matrices with a unified base matrix , the number, z, of multiple square matrices for each code rate being determined by the code rate in order to accommodate codes of multiple rates and sizes, all code rates using the unified base matrix, wherein the unified base matrix definition is a concatenation of the following multiple square matrices with the unified base matrix:

$$S_{m\times Rm}=(S^{R}_{m\times m}|S^{R-1}_{m\times m}| \ldots |S^{3}_{m\times m}|S^{2}_{m\times m}|S^{1}_{m\times m})$$

and the base matrix for rate (r−1 )/r is $$S_{m\times rm}=(S^{r}_{m\times m}|S^{r-1}_{m\times m}| \ldots |S^{3}_{m\times m}|S^{2}_{m\times m}|S^{1}_{m\times m})$$

For r=2, 3, . . . , R.

2. The apparatus of claim 1, wherein the row length m of said unified base matrix definition is a minimum of 4.

3. The apparatus of claim 2, wherein base matrix sizes are 4×8 for rate 1/2, 4×12 for rate 2/3, 4×16 for rate 3/4, 4/24 for rate 5/6, and 4×32 for rate 7/8.

4. The apparatus of claim 3, wherein said unified base matrix definition is:

$$S_{4\times32}=(S^{8}_{4\times4}|S^{7}_{4\times4}|S^{6}_{4\times4}|S^{5}_{4\times4}|S^{4}_{4\times4}|S^{3}_{4\times4}|S^{3}_{4\times4}|S^{2}_{4\times4}|S^{1}_{4\times4}) \text{ for rate 7/8.}$$

5. The apparatus of claim 3, wherein said unified base matrix definition is:

$$S_{4\times24}=(S^{6}_{4\times4}|S^{5}_{4\times4}|S^{4}_{4\times4}|S^{3}_{4\times4}|S^{2}_{4\times4}|S^{1}_{4\times4}) \text{ for rate 5/6.}$$

6. The apparatus of claim 3, wherein said unified base matrix definition is:

$$S_{4\times16}=(S^{4}_{4\times4}|S^{3}_{4\times4}|S^{2}_{4\times4}|S^{1}_{4\times4}) \text{ for rate 3/4.}$$

7. The apparatus of claim 3, wherein said unified base matrix definition is:

$$S_{4\times12}=(S^{3}_{4\times4}|S^{2}_{4\times4}|S^{1}_{4\times4}) \text{ for rate 2/3.}$$

8. The apparatus of claim 3, wherein said unified base matrix definition is:

$$S_{4\times8}=(S^{2}_{4\times4}|S^{1}_{44}) \text{ for rate 1/2.}$$

9. The apparatus of claim 1, wherein the unified base matrix definition is a concatenation of multiple square matrices and the unified base matrix for a particular code rate and size.

10. The apparatus of claim 1, wherein the structure includes a family of codes of different sizes obtained by using different expansion factors of different sizes.

11. The apparatus of claim 1, wherein the expansion factor comprises a diagonal of an identity matrix applied to the base matrix definition using a shift s.

12. A method of forward error correction, comprising:

employing a transceiver configured to use in transmissions a unified quasi-cyclic low-density parity-check structure for variable code rates and sizes, the structure being determined by an expansion factor z and a unified base matrix definition that accommodates codes of multiple rates and sizes, wherein the unified base matrix definition is a concatenation of multiple square matrices $$S_{m\times rm}=(S^{r-1}_{m\times m}| \ldots |S^{3}_{m\times m} |S^{2}_{m\times m}S^{1}_{m\times m})$$

for r=2, 3, . . . ,R.

13. The method of claim 12, wherein the unified base matrix definition is a concatenation of multiple square matrices and the unified base matrix for a particular code rate and size.

14. The method of claim 12, wherein the structure includes a family of codes of different sizes obtained by using different expansion factors of different sizes.

15. The method of claim 12, wherein the expansion factor comprises a diagonal of an identity matrix applied to the base matrix definition using a shift s.

16. An article comprising a storage medium having stored thereon instructions, that, when executed by a computing platform: results in providing forward error correction, by controlling a transceiver configured to use in transmission a unified quasi-cyclic low-density parity-check structure for variable code rates and sizes, the structure being determined by an expansion factor z and a-unified base matrix definition that is a concatenation of multiple square matrices with a unified base matrix , the number, z, of multiple square matrices for each code rate being determined by the code rate in order to accommodate and that accommodates codes of multiple rates and sizes, all code rates using the unified base matrix, wherein said unified base matrix definition may be a concatenation of multiple square matrices $$S_{m\times Rm}=(S^{R}_{m\times m}|S^{R-1}_{m\times m}| \ldots |S^{3}_{m\times m}|S^{2}_{m\times m}|S^{1}_{m\times m})$$

and the base matrix for rate (r−1)/r may be $$S_{m\times rm}=(S^{r}_{m\times m}|S^{r-1}_{m\times m}| \ldots |S^{3}_{m\times m}|S^{2}_{m\times m}|S^{1}_{m\times m})$$

for r=2,3, . . . , R.

* * * * *